(12) United States Patent
Hsu et al.

(10) Patent No.: US 9,494,672 B2
(45) Date of Patent: Nov. 15, 2016

(54) DEPLOYMENT METHOD FOR HIGH-CONCENTRATION PHOTOVOLTAIC POWER GENERATION SYSTEM

(71) Applicant: ATOMIC ENERGY COUNCIL-INSTITUTE OF NUCLEAR ENERGY RESEARCH, Taoyuan County (TW)

(72) Inventors: Wan-Li Hsu, Taoyuan County (TW); I-Tao Lung, Taoyuan County (TW)

(73) Assignee: Atomic Energy Council—Institute of Nuclear Energy Research, Taoyuan County (TW)

( * ) Notice: Subject to any disclaimer, the term of this patent is extended or adjusted under 35 U.S.C. 154(b) by 248 days.

(21) Appl. No.: 14/482,088

(22) Filed: Sep. 10, 2014

(65) Prior Publication Data

US 2016/0069981 A1 Mar. 10, 2016

(51) Int. Cl.
| | | |
|---|---|---|
| G01C 21/02 | (2006.01) | |
| H01L 31/052 | (2014.01) | |
| G01S 3/786 | (2006.01) | |
| F24J 2/38 | (2014.01) | |
| F24J 2/40 | (2006.01) | |
| F24J 2/14 | (2006.01) | |
| F24J 2/07 | (2006.01) | |

(52) U.S. Cl.
CPC ............... *G01S 3/7861* (2013.01); *F24J 2/07* (2013.01); *F24J 2/14* (2013.01); *F24J 2/38* (2013.01); *F24J 2/402* (2013.01); *H01L 31/0525* (2013.01)

(58) Field of Classification Search
CPC ..... G01S 3/7861; H01L 31/0525; F24J 2/07; F24J 2/14; F24J 2/38; F24J 2/402
USPC ........................................ 250/201.4; 136/246
See application file for complete search history.

(56) References Cited

U.S. PATENT DOCUMENTS

| | | | | |
|---|---|---|---|---|
| 7,109,461 | B2* | 9/2006 | Lasich | F24J 2/38 126/578 |
| 8,893,713 | B2* | 11/2014 | Wares | H01L 31/0525 126/571 |
| 9,281,431 | B2* | 3/2016 | Linderman | H01L 31/0525 |
| 2010/0163014 | A1* | 7/2010 | Johnson | F24J 2/14 126/573 |

* cited by examiner

*Primary Examiner* — Seung C Sohn
(74) *Attorney, Agent, or Firm* — Rosenberg, Klein & Lee

(57) ABSTRACT

The present invention relates to a deployment method for high-concentration photovoltaic power generation system, According to the present invention, after acquiring the location parameters of a solar tracker array, the surface images of the receiving surface of the solar trackers are acquired subsequently. Afterwards, the numbers of the white and grey pixels in the surface images are analyzed for giving the shadowing ratio. According to the shadowing ratio, the estimated power generation can be calculated. Thereby, the related supplier can refer to the simulated data for improving the deployment. By adjusting to a better deployment for constructing the high-concentration solar tracker array, high power-generation benefit can be utilized given the existing land condition.

13 Claims, 4 Drawing Sheets

DEPLOYMENT METHOD FOR HIGH-CONCENTRATION PHOTOVOLTAIC POWER GENERATION SYSTEM

FIELD OF THE INVENTION

The present invention relates generally to a deployment method for power generation system, and particularly to a high-concentration photovoltaic power generation system, which, after acquiring the images of the receiving surfaces of solar trackers, analyzes the shadowing ratio and calculates the estimated power generation as references for adjusting the deployment.

BACKGROUND OF THE INVENTION

The fundamental operational principle of photovoltaic power generation is to illuminate the sunlight on the surface of solar cell. While using the power generation system, an important factor is on enhancing the efficiency of absorbing solar energy. The illumination angle of the sunlight changes periodically in a year and according to the geographical location. In addition, even in a day, the illumination angle changes according to the time. Thereby, tracking the location of illumination angle of the sun for acquiring the maximum illumination is a critical subject in a photovoltaic power generation system.

Currently, many types of practical solar tracking systems have been developed. The solar trackers formed by integrating these solar tracking systems with large-scale solar-cell panels are generally deployed in an array within a zone. By increasing the number of solar trackers in the array, the overall power generation can be increased. As described above, the angle of illumination of the sun differs according to the geographical location and time. In order to receive the illumination of the sunlight more effectively, the solar panels in solar trackers are disposed at an angle. Under such a circumstance, when solar trackers are deployed closely, the problem of inter-shadowing occurs frequently.

Furthermore, the problem of inter-shadowing results from shadowing of a portion of the sunlight on a solar tracker by adjacent solar trackers. Thereby, the solar panel of the solar tracker cannot receive the complete sunlight, making the realistic power generation lower than the rated value.

Accordingly, if the distance among solar trackers is increased, the influence of inter-shadowing could be reduced. Nonetheless, this means that a larger land is required for accommodating the same number of solar trackers. The solution brings the side effect. How to balance between power generation and land utility has become an issue to be considered. If a novel simulation method could be proposed so that the deployment can be simulated with convenience by the supplier in the technical field, assessment can be performed before disposing solar trackers in order to reduce the shadowing effect to a reasonable range, which is then beneficial to the development and promotion of photovoltaic power generation systems.

SUMMARY

An objective of the present invention is to provide a deployment method for high-concentration photovoltaic power generation system, which is capable of constructing a virtual solar-tracker array on a computer. The solar tracker array is composed of a plurality of solar trackers. The method according to the present invention can simulate the inter-shadowing phenomenon among solar trackers when they are illuminated by the sunlight. Then, by analyzing the degree of shadowing, the influence on power generation can be assessed. Hence, the deployment of solar track array can be altered for reducing shadowing and thus increasing power generation.

Another objective of the present invention is to provide a deployment method for high-concentration photovoltaic power generation system. A user can change the location parameters of solar trackers directly. Then the adjusted power generation can be estimated in real time. Accordingly, further modifications can be made, and thus bring practical values.

Still another objective of the present invention is to provide a deployment method for high-concentration photovoltaic power generation system, which is also applicable to physical solar trackers. Once the source of surface image is changed to the picture taken on the physical solar trackers, analysis and calculation can be performed as well. Thereby, the deployment improvement engineering can be performed on an existing solar track array or a solar tracker array under construction.

In order to achieve the objectives described above, the present invention discloses a deployment method for high-concentration photovoltaic power generation system used for analyzing the deployment of a plurality solar trackers. The method comprises steps of: acquiring a location parameter of the plurality of solar trackers; acquiring a plurality of grey pixels of the receiving surface of the plurality of solar trackers; analyzing the plurality of grey pixels for calculating a shadowing ratio of the plurality of solar trackers; and adjusting the location parameter of the plurality of solar trackers according to the shadowing ratio for reducing the shadowing ratio of the plurality of solar trackers.

DETAILED DESCRIPTION

In order to make the structure and characteristics as well as the effectiveness of the present invention to be further understood and recognized, the detailed description of the present invention is provided as follows along with embodiments and accompanying figures.

The deployment method for high-concentration photovoltaic power generation system is used for reducing the inter-shadowing effect in a high-concentration solar tracker array in a photovoltaic power generation system and proposing plans for improvement for existing power generation systems. Alternatively, the present invention performs fast calculations for optimum deployment of power generation systems under planning and proposes an effective deployment method by simulation for solving problems. Thereby, suppliers of the technical field can emulate the deployment in the real time.

Figure 1:
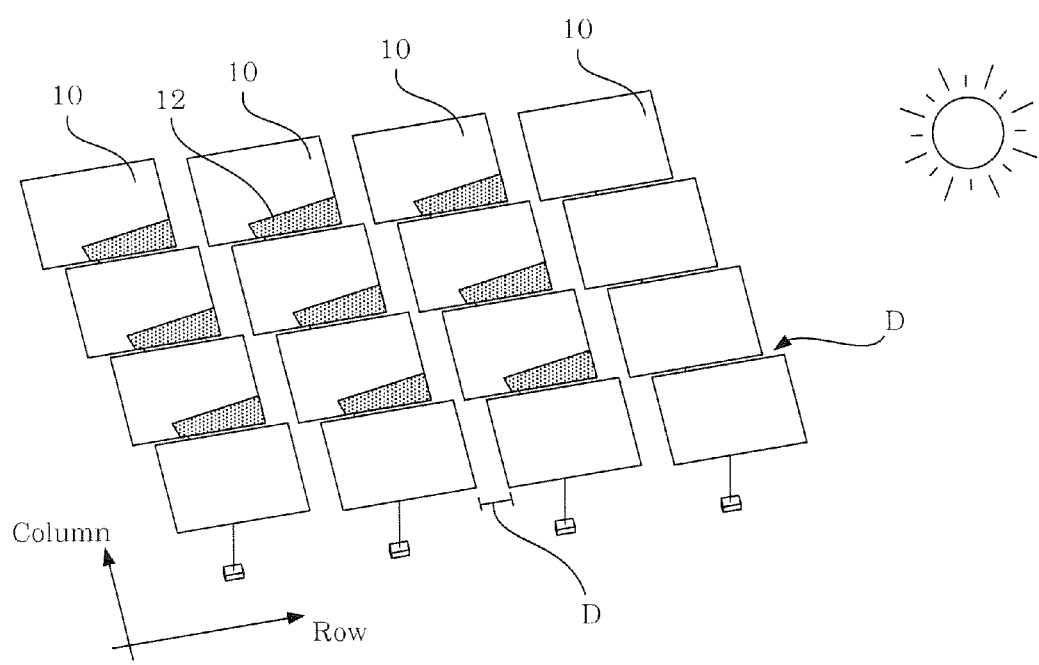
FIG. 1 shows a schematic diagram of the solar tracker array undergoing shadowing simulation according to the present invention.

The technical scheme according to the present invention is to simulate and analyze a solar track array, which comprises a plurality of high-concentration solar trackers. Please refer to FIG. 1. The solar trackers 10 are generally aligned in rows and columns. A single solar tracker 10 owns a column location and a row location and forming its coordinate on a plane. Besides, there is a spacing D between a solar tracker 10 and an adjacent one. The spacing D is the spacing between two adjacent columns and between two rows. Given the limitation of land, shrinking the spacing between solar trackers increases the installation number of the solar trackers 10. Nonetheless, the closer deployment increases the inter-shadowing effect among solar trackers 10. For example, in the figure, parts of the solar trackers 10 are shadowed and thus appearing shadow areas 12. By increasing the shadowing ratio, the direct influence is the reduction of power generation.

Figure 2:
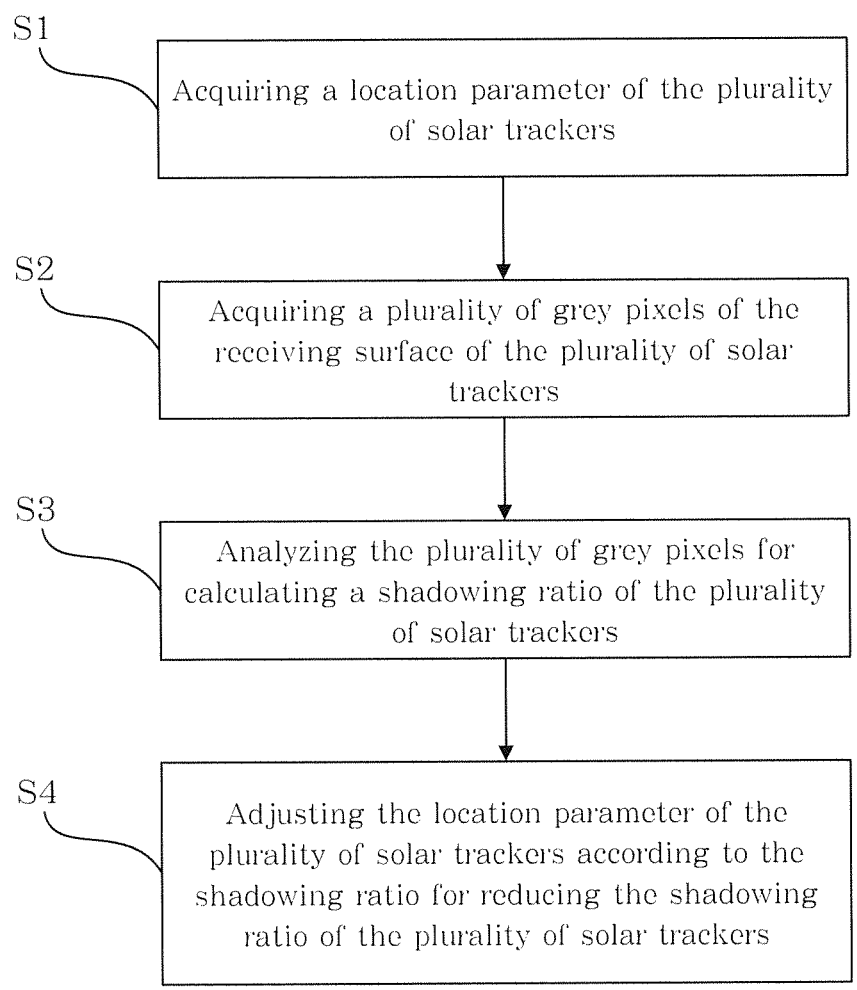
FIG. 2 shows a flowchart of the method according to the present invention.

Under such a background condition, as shown in FIG. 2, the simulation method according to the present invention comprises steps of:

Step S1: Acquiring a location parameter of the plurality of solar trackers;
Step S2: Acquiring a plurality of grey pixels of the receiving surface of the plurality of solar trackers;
Step S3: Analyzing the plurality of grey pixels for calculating a shadowing ratio of the plurality of solar trackers; and
Step S4: Adjusting the location parameter of the plurality of solar trackers according to the shadowing ratio for reducing the shadowing ratio of the plurality of solar trackers.

According to the above steps, the location parameter of the solar tracker 10 is the identification basis for positioning respective solar trackers 10. The positioning result is then numbered. The location parameter comprises the column location, the row location, and the spacing of the plurality of high-concentration solar trackers. In other words, the original locations of the entire high-concentration solar tracker array before deployment optimization are acquired.

The high-concentration solar trackers according to the present embodiment of the present invention are stored in a computer. They are virtual objects in a virtual environment constructed by programs or software. It is more rapid and convenient in calculations and parameter adjustments. In addition, they can be integrated into independent software. The associated suppliers can get the optimized result rapidly by operating the software for further reference.

After acquiring the locations of the solar trackers, in the step S2, the illumination pattern of the solar trackers 10 by the sun is extracted for giving the surface image of each of the solar trackers 10. The surface images are saved as an independent file for further analysis. In this stage, the user can extract the pictures in the virtual environment. The acquired surface image is shown as in FIG. 3, with a viewing angle perpendicular to the receiving surface 20 of the solar tracker 10. The photographed surface image includes two color blocks. One the brighter white block 22; the other is the grey block 24 (or dark block) produced by the shadow of the peripheral high-concentration solar tracker.

Because the present embodiment is operated in a computer, it is required to perform the simulation of sun illumination. The simulation parameters of sun illumination can be given by the Sunlight system as described in the technical filed of the present invention. By entering the environmental simulation parameters including the time (such as hour, minute, and second), the date (such as year, month, and date), the longitude, and the latitude, the location of the sun can be simulated. The simulated sun can thus illuminate the receiving surface 20 of the solar tracker 10 in the simulated environment.

Figure 3:
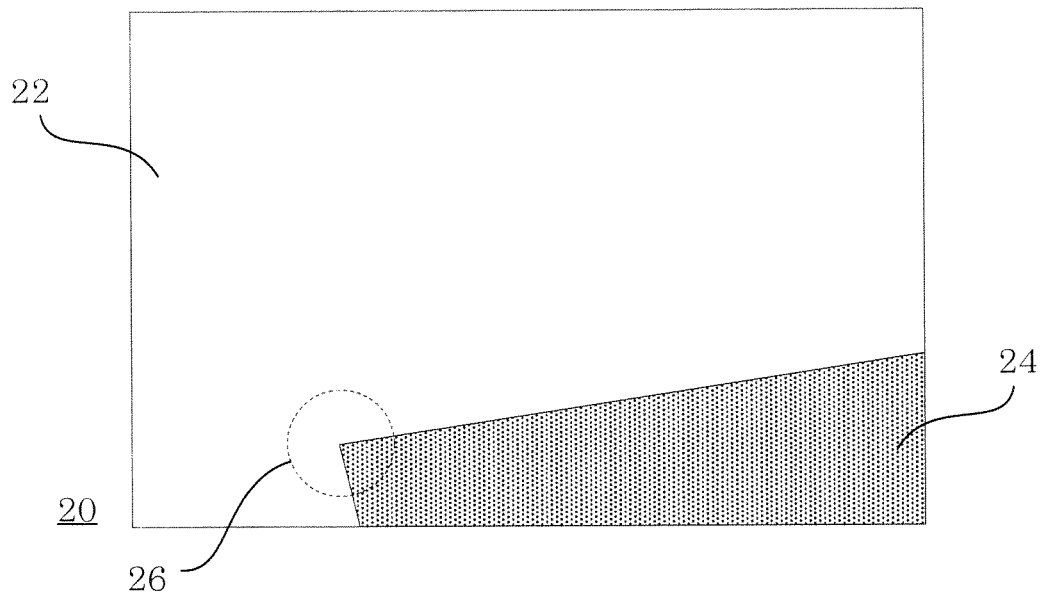
FIG. 3 shows a schematic diagram of the surface image taken on the receiving surface of the solar tracker according to a preferred embodiment of the present invention.
Figure 4:
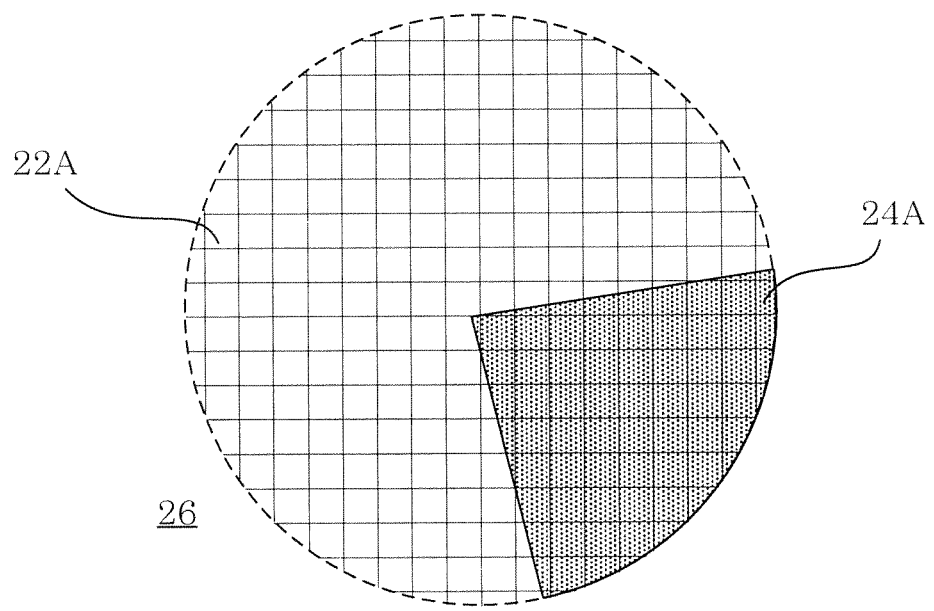
FIG. 4 shows a partial enlarged diagram of FIG. 3, used for showing the white pixels and grey pixels of the partially enlarge region 26.

After acquiring the surface image, the acquired surface can be analyzed. As shown in FIGS. 3 and 4, the operation for analysis is to search one by one the surface images the solar trackers 10 for giving the number of the white pixels 22A and that of the grey pixels 24A in the surface images. The white pixels 22A form the region receiving the illumination of the sun; the grey pixels 24A are the portion with the shadowing effect cause by the blocking by adjacent solar trackers 10. After summing the numbers of the white and grey pixels 22A, 24A, dividing the sum by the number of the grey pixels 24A gives the shadow ratio of each solar tracker 10. In addition, the shadow ratio of the entire solar tracker array can be given as well.

The shadow ratio of a high-concentration solar tracker is closely related to it power generation. If the shadow ratio is higher, it means that the power generation is lower. Because the rated power generation of each solar tracker 10 is a fixed value, by including the shadow ratio for lowering proportionately the rated power generation, the power generation of the solar tracker 10 can be estimated. By referring to these values of power generation, how to adjust the current deployment of the solar track array will be known. Namely, the solar trackers 10 with lower estimated power generation can be moved to locations less shadowed by adjacent solar trackers 10. A simple method is to extend the spacing D directly. The default value of the spacing D is 1.5 times the length of a single solar tracker. The user can use this default value as a baseline for adjustment in the unit of meter.

A solar tracker array generally contains a substantial amount of solar trackers. Thereby, while adjusting the deployment on an allowable land, a normal practice to increase the spacing among these solar trackers 10 for reducing the shadow effect. If the current estimated power generation has reached the rated power generation, the spacing among these solar trackers 10 can be shrunk for increasing their density. Consequently, the power generation per unit land area can be improved.

As described above, the solar trackers according to the present embodiment of the present invention are virtual objects in a virtual environment constructed by programs or software. When the program in the computer executes the steps according to the present invention, the high-speed operating capability of the computer can respond in the real time the adjusted estimated power generation to the user for reference after the user adjusts the location parameters, such as the column location, the row location, and the spacing, of the high-concentration solar tracker. Alternatively, the maximum estimated power generation can be further calculated automatically and thus fulfilling the function of automatic deployment optimization.

Nonetheless, according to another embodiment of the present invention, the operation is not limited to a computer. The simulation method for shadowing according to the present invention can be applied to physical solar trackers as well. In this condition, a camera or a video recorder can be used for photographing an installed solar track array or a solar tracker array model (for example, building low-cost plywood for emulating physical solar trackers). Thereby, the realistic illumination effect by the sunlight can be given. Because photographing is performed on physical solar trackers, the photographing time, date, and the longitude and latitude of solar trackers can be recorded with ease. Then, as in the steps S2 to S4, the acquired data are input into the computer for analysis and computation. That is to say, according to the statistics of the pixels of the surface image, the shadow ratio of the physical solar trackers and their array can be given. At last, the location parameters of the solar trackers can be adjusted, for example, moving the solar trackers, for improving the deployment of the existing solar trackers or the solar trackers under construction.

Table 1 shows the shadow ratio (%) and estimated power generation (kW) for different spacings by simulating a solar tracker array. The set power of each solar tracker is 7.5 kW. The solar trackers are arranged in 9 columns and 15 rows for forming an array with spacing ranging from 9 to 13 meters. The values are observed at 16:30 of the Spring Equinox, the Summer Solstice, the Autumnal Equinox, and the Winter Solstice of a year and at the location of E121.15 and N24.51.

TABLE 1

| Date | Item | 9 m | 10 m | 11 m | 12 m | 13 m |
|---|---|---|---|---|---|---|
| Spring Equinox 3/20 | Shadow ratio (%) | 41.60 | 36.37 | 31.08 | 26.46 | 21.91 |
| | Power generation (kW) | 591.35 | 644.25 | 697.8 | 744.61 | 790.71 |
| Summer Solstice 6/21 | Shadow ratio (%) | 22.46 | 16.44 | 12.01 | 8.07 | 4.69 |
| | Power generation (kW) | 785.13 | 846.01 | 890.90 | 930.80 | 965.00 |
| Autumnal Equinox 9/23 | Shadow ratio (%) | 49.86 | 44.82 | 40.25 | 35.72 | 31.48 |
| | Power generation (kW) | 507.65 | 558.74 | 604.92 | 650.88 | 693.81 |
| Winter Solstice 12/22 | Shadow ratio (%) | 65.01 | 58.98 | 52.35 | 45.35 | 38.03 |
| | Power generation (kW) | 354.23 | 415.33 | 482.48 | 553.30 | 627.42 |

As shown in Table 1, the user can change the spacing among the solar trackers, for example, extending the spacing, for reducing the inter-shadowing effect and increasing the estimated power generation. Meanwhile, when the user changes the spacing, he can know the influence of the adjustment on the estimated power generation in the real time. Thereby, he can further assess if the adjusted deployment could be adopted.

Figure 5:
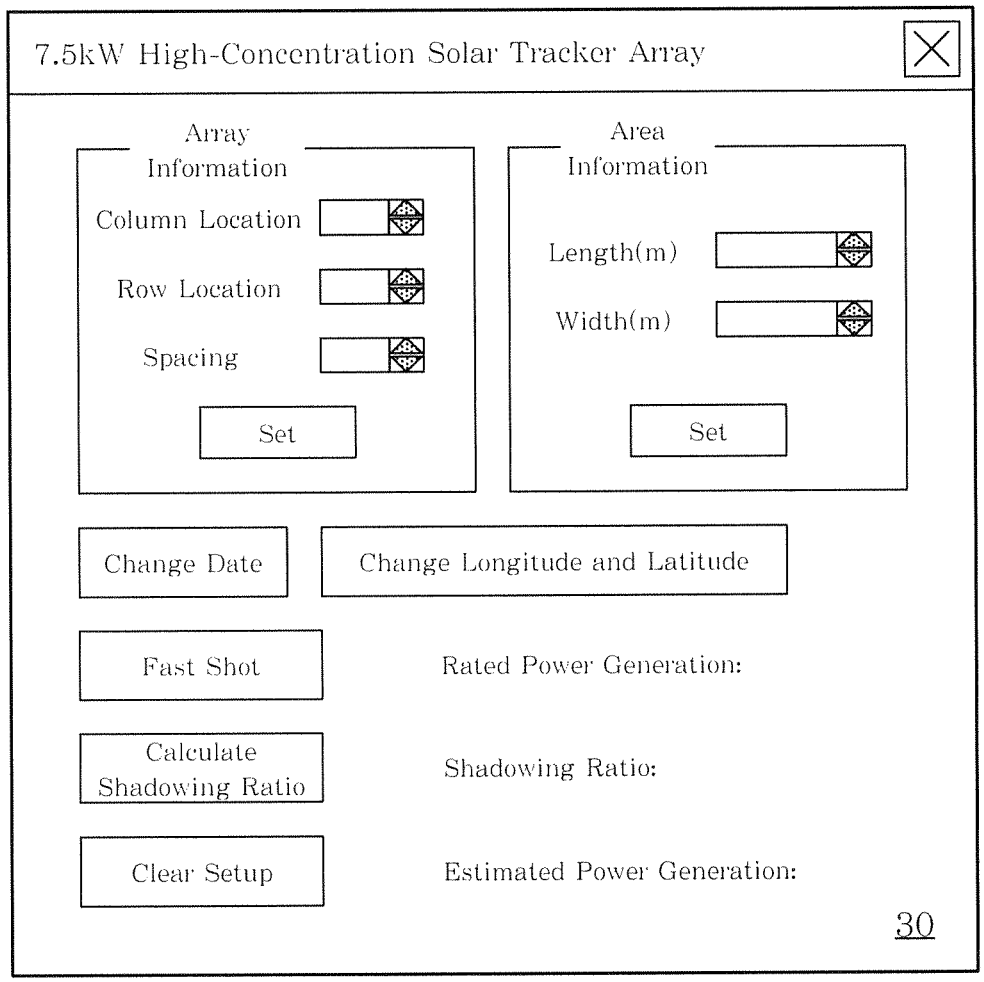
FIG. 5 shows a schematic diagram of the user interface while executing simulation on a computer according to a preferred embodiment of the present invention.

FIG. 5 shows an example of the user interface according to a preferred embodiment of the present invention. As shown in the figure, the user only needs to enter the location parameters including the column location, the row location, and the spacing of the solar tracker in a solar tracker array for calculating and displaying the shadow ratio and the estimated power generation directly. In addition, the area parameters of the land where the solar tracker array is situated, including the length and width of the region, can be considered altogether for preventing the range of the solar tracker array from exceeding the usable range of land.

The graphical user interface 30 as described above is a program built by computer languages for facilitating effective and practical operations of the shadowing simulation method for photovoltaic power generation systems disclosed by the present invention. According to the present invention, the language MaxScript of the software 3D Studio Max by the company Autodesk can be used as the tool for simulation, which includes building the user interface, building the 3D models of solar trackers and calculating their locations of disposition, simulating sun illumination on the surfaces of the 3D models, taking the simulated images of sunlight illumination, giving the shadowing ratio by calculating the numbers of the white and grey pixels in the images, and thus calculating the estimated power generation and displaying the calculation result on the user interface. Nonetheless, the present invention is not limited to the software or the program language for constructing the simulation system.

To sum up, the present invention discloses in detail a deployment method for high-concentration photovoltaic power generation. According to the present invention, visualization is presented in a emulated dynamic fashion. Supplier of photovoltaic power generation can use hardware such as computers to preview the overall perspective of the virtual solar tracker array as well as considering various possibilities of deployment in different operating conditions of time and region. Thereby, the most appropriate pattern of deployment can be found for constructing a high-concentration solar tracker array and thus fully utilizing the benefits of the given land condition. Thanks to the real-time advantage and high degree of emulation, rapid optimization on the deployment of solar trackers can be fulfilled and hence reducing the construction cost of the suppliers in the field. In short, the present invention truly provides a deployment method for high-concentration photovoltaic power generation with economic and practical values.

Accordingly, the present invention conforms to the legal requirements owing to its novelty, nonobviousness, and utility. However, the foregoing description is only embodiments of the present invention, not used to limit the scope and range of the present invention. Those equivalent changes or modifications made according to the shape, structure, feature, or spirit described in the claims of the present invention are included in the appended claims of the present invention.

The invention claimed is:

1. A deployment method for high-concentration photovoltaic power generation system, used for analyzing the deployment of a plurality solar trackers, and comprising steps of:
   acquiring a location parameter of said plurality of solar trackers;
   acquiring a plurality of grey pixels of a receiving surface of said plurality of solar trackers;
   analyzing said plurality of grey pixels for calculating a shadowing ratio of said plurality of solar trackers; and
   adjusting said location parameter of said plurality of solar trackers according to said shadowing ratio for reducing said shadowing ratio of said plurality of solar trackers.

2. The deployment method for high-concentration photovoltaic power generation system of claim 1, wherein said plurality of solar trackers are high-concentration solar trackers.

3. The deployment method for high-concentration photovoltaic power generation system of claim 1, wherein said location parameter includes a column location, a row location, and a spacing of said plurality of solar tracker.

4. The deployment method for high-concentration photovoltaic power generation system of claim 1, and further acquiring a plurality of white pixels of said receiving surface of said plurality of solar trackers in said step of acquiring said plurality of grey pixels of said receiving surface of said plurality of solar trackers.

5. The deployment method for high-concentration photovoltaic power generation system of claim 4, wherein said step of analyzing said plurality of grey pixels for calculating said shadowing ratio of said plurality of solar trackers includes calculating the total number of said plurality of white pixels and said plurality of grey pixels and dividing the total number by the number of said plurality of grey pixels for giving said shadowing ratio.

6. The deployment method for high-concentration photovoltaic power generation system of claim 1, wherein said receiving surface in said step of acquiring said plurality of grey pixels of said receiving surface of said plurality of solar trackers is illuminated by the sun.

7. The deployment method for high-concentration photovoltaic power generation system of claim 1, wherein said plurality of solar trackers are constructed in a virtual environment.

8. The deployment method for high-concentration photovoltaic power generation system of claim 7, wherein said receiving surface in said step of acquiring said plurality of grey pixels of said receiving surface of said plurality of solar trackers is illuminated by the sun in said virtual environment according to a plurality of environmental simulation parameters.

9. The deployment method for high-concentration photovoltaic power generation system of claim 8, wherein said plurality of environmental simulation parameters includes a date parameter, a time parameter, a longitude parameter, and a latitude parameter.

10. The deployment method for high-concentration photovoltaic power generation system of claim 1, and further adjusting said location parameter within the range of a regional area parameter according to said regional area parameter in said step of adjusting said location parameter of said plurality of solar trackers according to said shadowing ratio.

11. The deployment method for high-concentration photovoltaic power generation system of claim 10, wherein said regional area parameter includes a regional length and a regional width.

12. The deployment method for high-concentration photovoltaic power generation system of claim 1, and adjusting on a computer via a user interface and acquiring the variation of an estimated power generation value in the real time in said step of adjusting said location parameter of said plurality of solar trackers according to said shadowing ratio.

13. The deployment method for high-concentration photovoltaic power generation system of claim 1, and used for analyzing the influence of the inter-shadowing effect of said plurality of solar trackers on an estimated power generation value when said plurality of solar trackers are deployed by different location parameters.

* * * * *